United States Patent [19]
Park et al.

[11] Patent Number: 6,008,541
[45] Date of Patent: Dec. 28, 1999

[54] PACKAGED INTEGRATED CIRCUIT DEVICE

[75] Inventors: Sang Wook Park, Ich'on; Hyung Gil Baig, Suwon, both of Rep. of Korea

[73] Assignee: Hyundai Electronics Industries Co., Ltd., Ich'on, Rep. of Korea

[21] Appl. No.: 09/060,140

[22] Filed: Apr. 15, 1998

[30]    Foreign Application Priority Data

Apr. 15, 1997 [KR]  Rep. of Korea ................ 97-13880

[51] Int. Cl.⁶ .......................... H01L 23/48; H01L 23/52; H01L 29/40
[52] U.S. Cl. ...................... 257/773; 257/706; 257/707; 257/775; 257/692
[58] Field of Search ................................ 257/773, 774, 257/775, 776, 692, 706, 707, 720, 625

[56]    References Cited

U.S. PATENT DOCUMENTS

| | | |
|---|---|---|
| 3,836,988 | 9/1974 | Baord . |
| 4,596,070 | 6/1986 | Bayrataroglu . |
| 4,924,276 | 5/1990 | Heime et al. . |
| 5,156,004 | 10/1992 | Wu et al. . |
| 5,223,747 | 6/1993 | Tschulena . |
| 5,313,094 | 5/1994 | Beyer et al. . |
| 5,341,027 | 8/1994 | Park et al. . |
| 5,455,384 | 10/1995 | Ichihara . |
| 5,545,921 | 8/1996 | Conru et al. . |
| 5,644,476 | 7/1997 | Weekamp et al. . |

*Primary Examiner*—Sheila V. Clark
*Attorney, Agent, or Firm*—Jacobson, Price, Holman & Stern, PLLC

[57]    ABSTRACT

Disclosed herein is a packaged integrated circuit device having symmetrical structure to minimize package warpage and to prevent the formation of voids. The packaged integrated circuit device includes an integrated circuit chip having pads in the form of the respective grooves on its both sides opposite to each other. Each pad groove in the integrated circuit chip is formed such that it penetrates vertically the integrated circuit chip. The surface of each pad groove is coated with solder. A plurality of inner lead structures each including an inner lead and a stopper are inserted into the pad grooves and are electrically connected with the pads. In each of the inner lead structures, solder is coated on a surface of portion being in contact with the pads. Each inner lead has a plate shape and is inserted vertically into the respective pad grooves. Each stopper has a plate shape and is formed in the respective inner leads such that it is laid horizontally upon the upper surface of the integrated circuit chip to prevent the inner lead from breaking away from the pads. In one embodiment, on a top end of the respective inner leads is placed the top portion of each of the outer leads to be electrically connected to the respective inner leads, and each of the stoppers is formed at middle height portion of the respective inner leads.

19 Claims, 5 Drawing Sheets

PACKAGED INTEGRATED CIRCUIT DEVICE

FIELD OF THE INVENTION

The present invention relates to a packaged integrated circuit device, and more particularly to a semiconductor integrated circuit device encapsulated in the plastic mold together with a plurality of electrically conductive leads.

BACKGROUND OF THE INVENTION

The semiconductor integrated circuit package having a plurality of leads located on a surface of the semiconductor integrated circuit chip or a substrate, is sometimes called as "lead- on- chip" or "lead- over-chip" (LOC) type package. Typical structure of the LOC type package is shown in FIG. 1.

Referring to FIG. 1, the LOC type package includes an integrated circuit chip 1 and a lead frame 2 attached on a surface of the integrated circuit chip 1 by an adhesive 6. The lead frame 2 comprises inner leads 21 for carrying the signals to the chip 1 and outer leads 22 which are electrically connected with an exterior device such as the printed circuit board. The inner leads 21 are electrically connected with bond pads of the chip 1 by metal wires 5 such as gold wires. The chip 1 and inner leads 21 are encapsulated in a plastic mold 3.

The LOC type package is advantageous in that it has reduced thickness and the crack phenomena are basically prevented from occurring.

However, the LOC type package has asymmetrical structure, in particular in its vertical direction. This is attributed to non-smooth flow of the mold 3 during the molding process. When flow of the mold 3 is not smooth, package warpage leading to package failure may be generated and voids can be formed in the mold 3. Moreover, the LOC type package shown in FIG. 1 is slow in carrying the signals, because the electrical connection between the chip 1 and inner leads 21 is accomplished by the metal wires 5. In addition, the LOC type package shown in FIG. 1 has a shortcoming that the resistance of solder joints of the outer leads to a substrate is low because lead height LH is low. Additionally, the LOC type package shown in FIG. 1 is not easy in dissipating heat generated from the chip 1.

SUMMARY OF THE INVENTION

It is therefore an object of the present invention to provide a packaged integrated circuit device having symmetrical structure to minimize package warpage and to prevent the formation of voids.

It is other object of the present invention to provide a packaged integrated circuit device of capable of increasing the signal carrying speed to the integrated circuit chip.

It is another object of the present invention to provide a packaged integrated circuit device having sufficiently high lead height to increase resistance of solder joints of the outer leads to a substrate.

It is yet another object of the present invention to provide a packaged integrated circuit device capable of easily dissipating heat generated from the integrated circuit chip.

A packaged integrated circuit device according to the present invention includes an integrated circuit chip having pads in the form of the respective grooves on its both sides opposite to each other. Each pad groove in the integrated circuit chip is formed such that it penetrates vertically the integrated circuit chip. The surface of each pad groove is coated with a material having electrical conductivity and weldability, for example solder. A plurality of inner lead structures each including an inner lead and a stopper are inserted into the pad grooves and are electrically connectdd with the pads. In each of the inner lead structures, a material with electrical conductivity and weldability, for example solder, is coated on the surface of portion being in contact with each of the pads. The inner leads each has a plate shape and is inserted vertically into the respective pad grooves. The stoppers each has a plate shape. In addition, each of the stoppers is formed in the respective inner leads such that it is laid horizontally upon the surface of the integrated circuit chip to prevent the inner lead from breaking away from the pads. In one embodiment, on a top end of each of the inner leads is placed a top portion of each outer lead to be electrically connected to the respective inner leads, so as to maximize the height difference between the upper portion and the lower portion of the respective outer leads. At this time, each of the stoppers is formed at middle height portion of the respective inner leads. In an alternative, each of the inner leads has the same vertical length as length of the respective pad grooves, and each of the stoppers is formed on the top end of each inner lead to which each outer lead with a bent shape is electrically connected in contact with the side end of each inner lead.

A packaged integrated circuit device according to the present invention includes an integrated circuit chip having pads in form of the respective grooves into which the inner leads of a plate shape are directly inserted. Accordingly, the packaged integrated circuit device according to the present invention has symmetric structure to be smooth the flow of the mold during the molding process, thereby minimizing the package warpage, and reducing voids in the mold. Moreover, since use of the metal wires is eliminated, it can prevent the signal carrier delay due to the metal wires. And, the packaged integrated circuit device according to the present invention utilizes the plate-shaped inner leads each inserted vertically into the respective pads in the chip, such that the lead height is maximized, whereby the resistance of solder joints of the outer leads to a substrate is maximized. In addition, the packaged integrated circuit device according to the present invention includes the inner leads excellent in the thermal conductivity, each protruded from a upper surface and a lower surface and extended near a surface of the mold, such that it can easily dissipate heat generated from the chip.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF THE PREFERRED EMBODIMENTS

Figure 1:
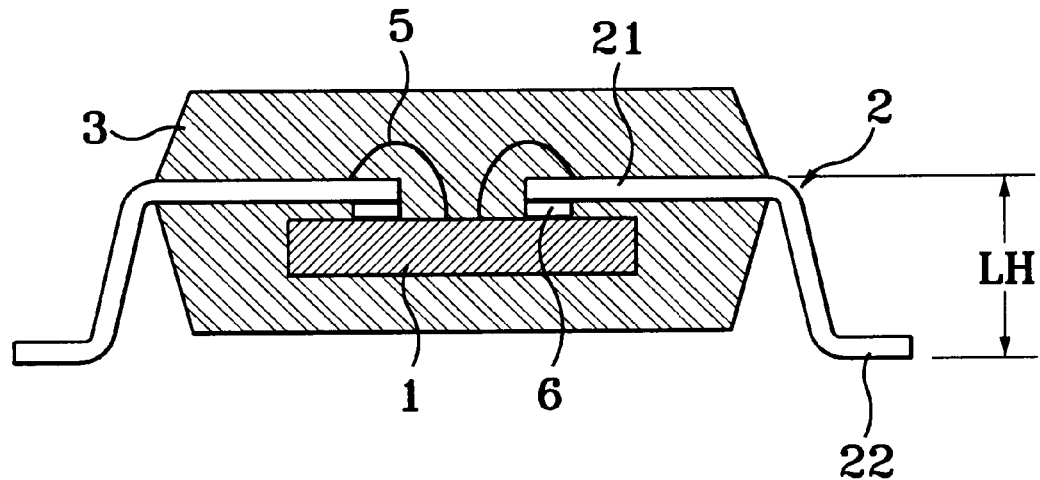
FIG. 1 is a cross section view showing a typical structure of a prior art LOC type package.
Figure 2:
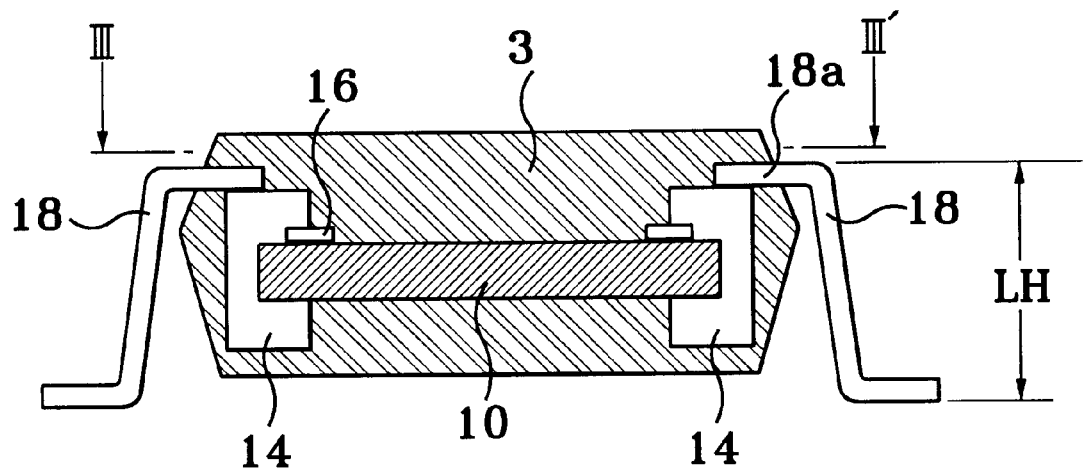
FIG. 2 is a cross section view showing a packaged integrated circuit device according to a first embodiment of the invention.
Figure 3:
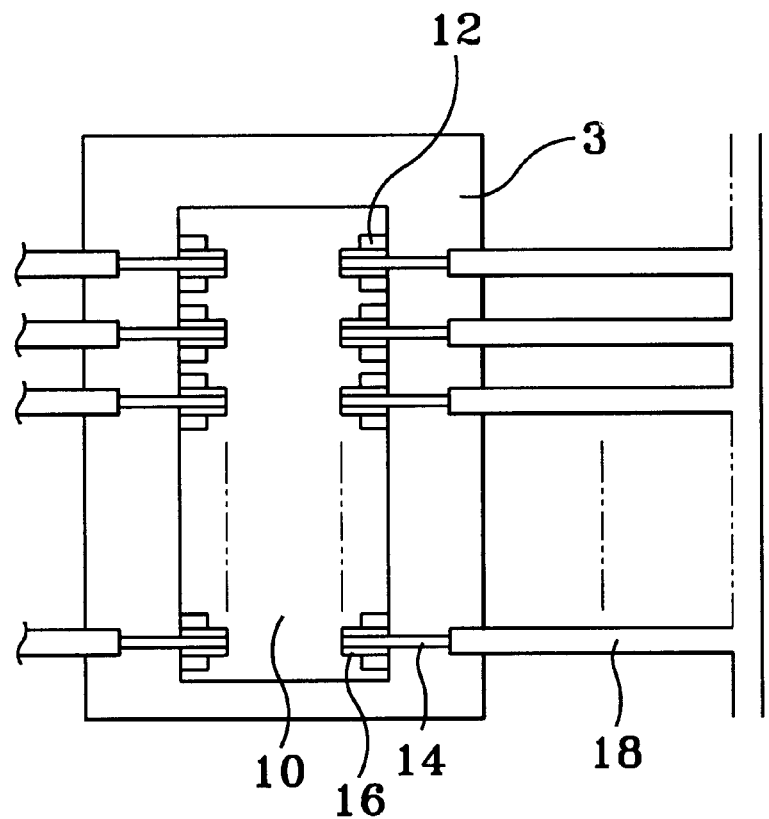
FIG. 3 is a cross section view of the packaged integrated circuit device shown in FIG. 2 taken along line III–III'.

Referring to FIG. 2 and FIG. 3 taken along line III–III' in FIG. 2, there is shown a packaged integrated circuit device according to a first embodiment of the invention. The device includes an integrated circuit chip 10. On both sides opposite to each other of integrated circuit chip 10, there are formed pads 12 in form of the respective grooves 11 which penetrate vertically into the chip 10. Into the groove 11 of each pad 12 is inserted an inner lead structure which consists of the inner lead 14 having a plate shape and a stopper 16 having a plate. The inner lead structure is electrically connected to each pad. Each of the inner leads 14 is inserted vertically into the groove 11 of each pad 12. Each of the stoppers 16 is formed vertically to the respective inner leads 14 such that each stopper 16 is laid horizontally upon the surface of the integrated circuit chip 10 to prevent the respective inner leads 14 from breaking away from the pads 12. On an upper surface of each of the inner leads 14 is stacked an upper horizontal portion 18a of each outer lead 18 having an shape, that substantially forms an elongated, offset so as to maximize the lead height LH. The integrated circuit chip 10 and the inner leads 14 are surrounded by a mold 3. Additionally, the inner leads 14 are protruded from upper and lower surfaces of the chip 10 and extended near a surface of the mold 3, in order to easily dissipate heat generated from the chip 10 by excellent thermal conductivity of the inner leads 14.

Figure 4A:
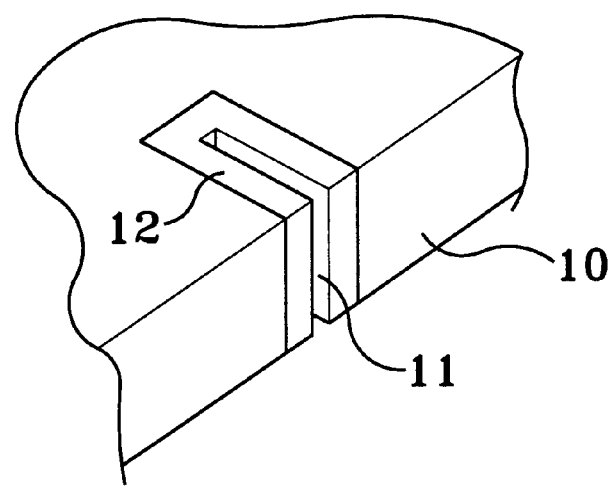
FIG. 4A is a perspective view showing a pad in form of groove in the packaged integrated circuit device shown in FIG. 2.

FIG. 4A shows each pad in the form of a groove 11 which is formed on sides of the chip in the device according to the first embodiment of the present invention. Each pad 12 is formed in accordance with the conventional etching technique, and has a rectangular groove 11 which penetrates vertically into the chip 10. The groove 11 has narrow width and the surface of the groove 11 is coated with a material of electrical conductivity and weldability, for instance solder.

Figure 4B:
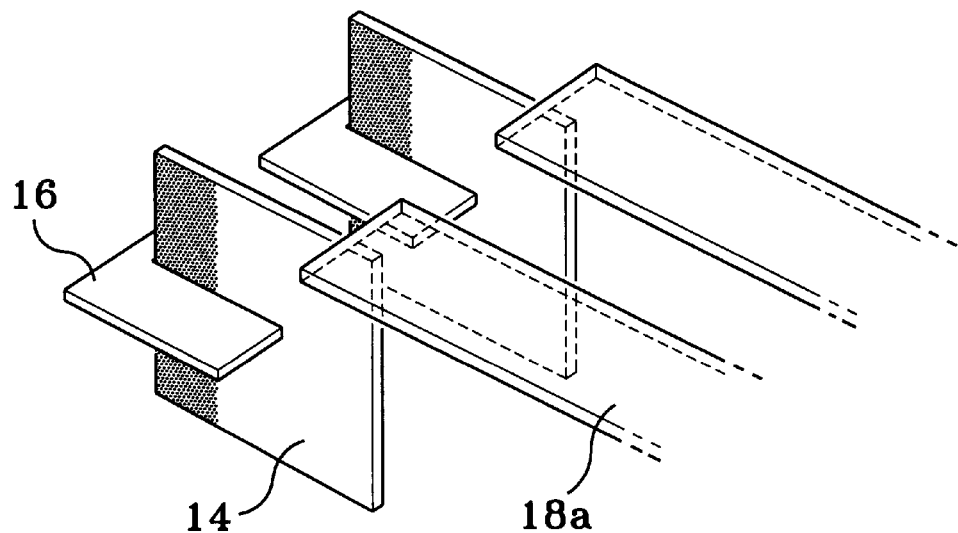
FIG. 4B is a perspective view showing an inner lead and an outer lead in the packaged integrated circuit device shown in FIG. 2.

FIG. 4B shows an inner lead structure to be inserted into the groove of the respective pads in the device according to the first embodiment of the present invention. The inner lead structure consists of an inner lead 14 and a stopper 16.

The inner lead 14 is made of a square-shaped plate having sufficiently thin thickness such that it is inserted into the groove of the pad on each of both sides opposite to each other of the chip. The inner lead 14 plate also has a sufficiently large size such that it is protrudes from upper and lower surfaces of the chip. The surface of the groove 11 and stopper 16 at portions to be contacted with the surface of the groove is coated with a material of electrical conductivity and weldability, for instance solder. The stopper 16 formed vertically to and on the inner lead 14 comprises a square-shaped plate. Moreover, when the inner lead 14 is inserted vertically into the groove of the pad, the stopper 16 is laid horizontally upon the upper surface of the chip to prevent the inner lead 14 from breaking away from each pad 12. The upper horizontal portion 18a of the outer lead 18 is stacked on the top end of the lead 14 to be electrically connected with the inner lead 14.

The packaged integrated circuit device according to the first embodiment of the present invention includes the inner leads 14 each inserted into the respective pads in form of the grooves, such that the device has symmetrical structure. Therefore, in encapsulating the integrated circuit chip 10 and the inner lead 14 by the mold 3, the flow of the mold is smooth.

Figure 5:
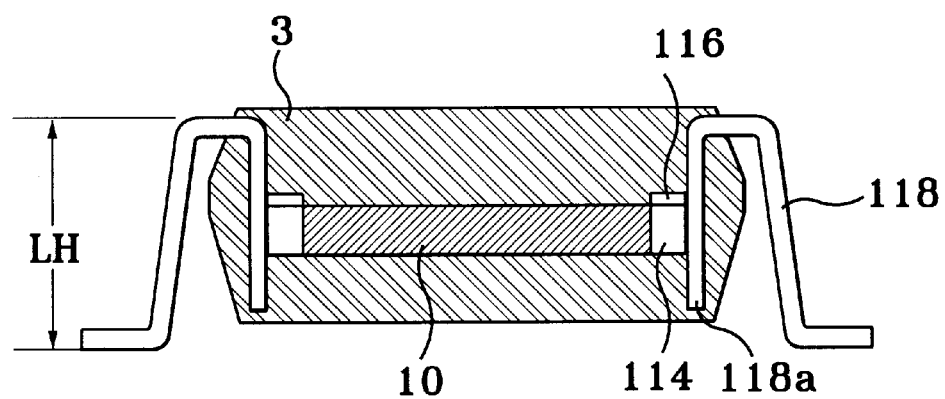
FIG. 5 is a cross section view showing a packaged integrated circuit device according to a second embodiment of the invention.

FIG. 5 is a cross section view showing a packaged integrated circuit device according to a second embodiment of the invention. Like the first embodiment, inner leads 114 of the inner lead structure in the device shown in FIG. 5 are inserted into the respective pad grooves on both sides opposite to each other of the chip 10 and supported by the respective stopper 116.

Figure 6:
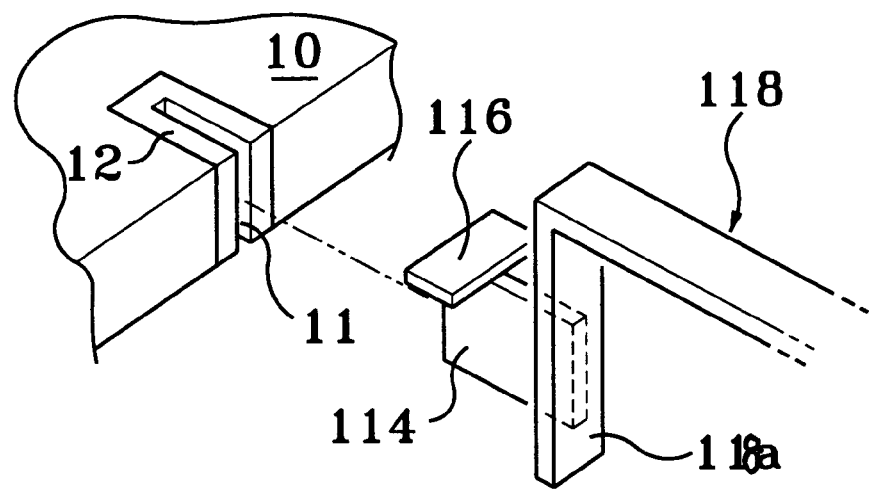
FIG. 6 is a perspective view showing connection between a pad and a lead in the packaged integrated circuit device according to a second embodiment of the invention.

However, as shown in FIG. 6 which is a perspective view showing connection between a pad and a lead in the packaged integrated circuit device according to a second embodiment of the invention, the vertical length of each inner lead 114 is the same as the length of each pad groove 11. Accordingly, when inserted into the grooves of the pads, the inner leads 114 do not protrude from the grooves 11 such that the inner leads 114 do not resist the flow of mold 3 during the molding process for encapsulating the chip and the inner leads. In order to prevent the inner leads 14 from breaking away from pads 12, each stopper is formed on the top end of each inner lead 114. Here, even if the stopper 116 in which the middle portion along the width direction of the stopper 116 is positioned on the top end of the inner lead 114 is shown in FIG. 6, the inner leads may have a upper portion bent with an angle of 90 degrees thereto and served as the stopper. Meanwhile, on the exposed side end of each inner lead 114 inserted into the respective pad grooves is connected in contact with a vertical portion 118a of each having shaped outer leads 118, such that each of the outer leads maintains a sufficient contact with the respective inner leads 114 and has the maximum lead height LH.

Figure 7:
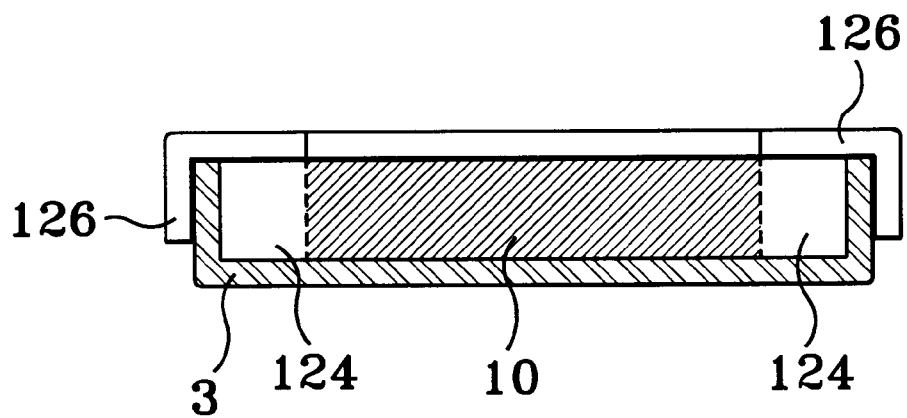
FIG. 7 is a cross section view showing a packaged integrated circuit device according to a third embodiment of the invention.

FIG. 7 is a cross section view showing a packaged integrated circuit device according to a third embodiment of the invention. Referring to FIG. 7, there is shown a chip size package different from the devices of the first and second embodiments of the invention in construction. The chip size package shown in FIG. 7 includes the integrated circuit chip 10 having the pads in form of the respective grooves which are formed on both sides opposite to each other of the chip and into which the respective inner lead structures are inserted to be electrically connected. Each of the inner lead structure consists of a inner lead 124 to be inserted vertically into the respective pads and a stopper 126. Each stopper 126 is formed on the top end of each inner lead and exposed to the exterior to serve as the electrical contact.

Figure 8:
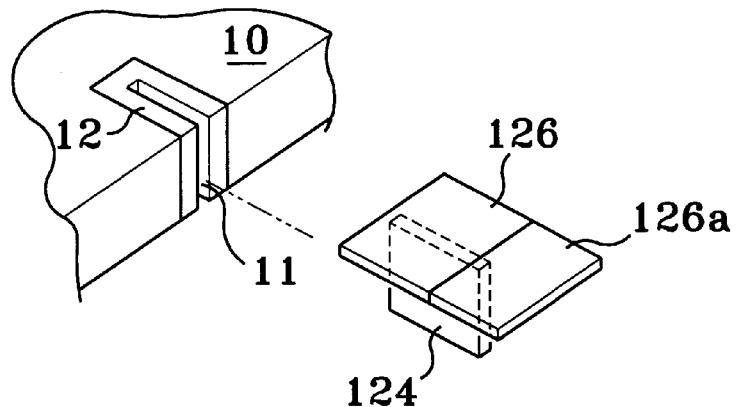
FIG. 8 is a perspective view showing connection between a pad and a lead in the packaged integrated circuit device shown in FIG. 7.

FIG. 8 is a perspective view showing connection between a pad and a lead in the packaged integrated circuit device shown in FIG. 7.

Referring to FIG. 8, the respective stoppers 126 are formed vertically to and on the top surface of each inner lead 124 of a squared plate having the same size as each groove 11. Each stopper 126 possesses the conductivity and has a portion 126a extended out of each inner lead 124 along the length direction of the top end of each inner lead. As a result, when each inner lead 124 is inserted into the respective pad grooves 11, the extended portion 126a of each stopper 126 is protruded from the side of the chip 10 and downwardly bent in parallel to the side of the chip 10. When such chip size package is mounted to an exterior device such as the printed circuit board, each stopper 126 serves as the electrical contact electrically connecting the chip 10 to the exterior device.

Figure 9:
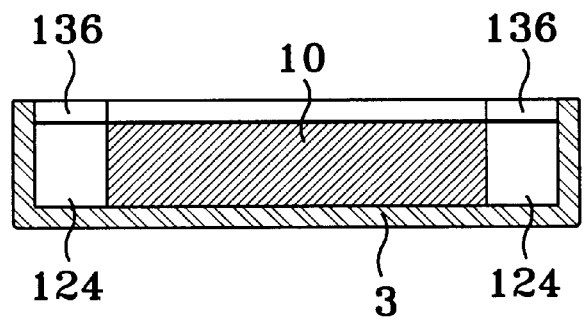
FIG. 9 is a cross section view showing a packaged integrated circuit device according to a fourth embodiment of the invention.

FIG. 9 is a cross section view showing a packaged integrated circuit device according to a fourth embodiment of the invention. Like the third embodiment as described above, the fourth embodiment of the invention is applied to the chip size package. Accordingly, like reference numerals designate like members having the same function throughout FIGS. 7 to 10. However, unlike the third embodiment, each stopper in the device according to the fourth embodiment does not include the extended portion as described above regarding the third embodiment, so as not to require forming the stoppers 136 during manufacturing of the device. This is enabled by the stoppers 136 not having portions extended out of the chip 10.

Figure 10:
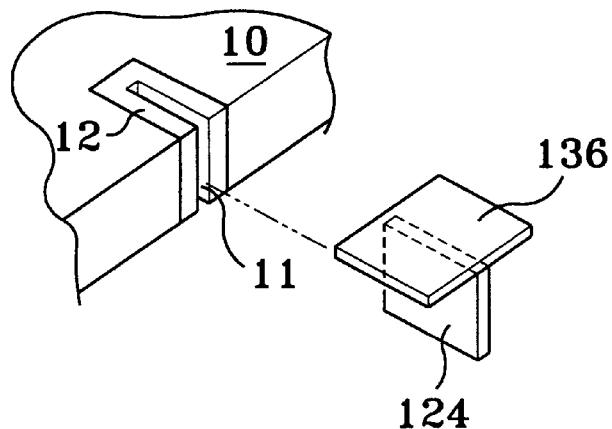
FIG. 10 is a perspective view showing a pad and an inner lead structure to be inserted into the pad in the packaged integrated circuit device shown in FIG. 9.

FIG. 10 is a perspective view showing a pad and an inner lead structure to be inserted into the pad in the packaged integrated circuit device shown in FIG. 9. Referring to FIG. 10, there is shown an inner lead structure consisting of an inner lead 124 to be inserted into a groove 11 of a pad 12 and a stopper 136 formed on the top end of the pad 12. The stopper 136 has a width portion which is extended along the length direction of the top end of the inner lead 124 and which has the same length as the length of the top end of the inner lead 124. Therefore, when inner lead 124 is inserted into the pad groove 11, the stopper 136 is not protruded from the side of the chip 10. When the chip size package according to the fourth embodiment is mounted to an exterior device such as the printed circuit board, each stopper 136 serves as the electrical contact electrically connecting the chip 10 to the exterior device.

In the packaged integrated circuit devices according to the third and fourth embodiments of the invention, the inner lead structure consisting of the inner lead and the electrically conductive stopper serves as the electrical contact electrically connecting the chip to the exterior device. However, in addition to serving as the electrical contact, the inner lead structure may be used in the chip size package as a heat spreader dissipating heat generated from the chip. In order to use the inner lead structure as the heat spreader, on at least one side of the integrated circuit chip is formed at least one groove that is not served as the pad. Into the groove is inserted the inner lead structure consisting of the inner lead of a thermally conductive material and the stopper of a thermally conductive material formed on the top end of the inner lead. And, the outer surface of the stopper is exposed to the exterior after formation of the mold encapsulating the integrated circuit chip.

As described above, the packaged integrated circuit device according to the invention includes the inner leads inserted directly into the pads in form of the respective grooves formed on the sides of the integrated circuit chip, such that the device has symmetrical structure. Thus, the package warpage due to non-smooth flow of the mold is minimized and the formation of voids is reduced. Also, in the packaged integrated circuit device according to the invention, the inner leads are inserted into the pad grooves to be electrically connected thereto without use of the metal wires, the signal carrier delay due to the metal wires is prevented. Additionally, in the packaged integrated circuit device according to the invention, the lead height is higher than that of the prior art package, such that the resistance of solder joints of the outer leads to a substrate is maximized. Finally, the packaged integrated circuit device according to the present invention includes the inner leads excellent in thermal conductivity, each protruded from a upper surface and a lower surface of the chip and extended near a upper surface and a lower surface of the mold, such that it can easily dissipate heat generated from the chip.

While this invention has been described with reference to illustrated specific embodiments, this description is not intended to be considered in a limiting sense. Various other embodiments will be apparent to persons skilled in the art upon reference to this description. It is therefore contemplated that the appended claims will cover any such modifications of embodiments as fall within the true scope of the invention.

What is claimed is:

1. A packaged integrated circuit device comprising:
    an integrated circuit chip having a plurality of pads in the form of grooves vertically penetrating opposite sides of the chip,;
    a plurality of inner lead structures, each inner lead structure comprising an inner lead having a plate shaped vertically extending portion inserted into the grooves and a stopper formed on and penetrating the inner lead and disposed horizontally upon an upper surface of the chip to prevent the inner lead from breaking away from the chip; and
    a mold encapsulating the chip and the inner lead structures.

2. The packaged integrated circuit device of claim 1, further comprising outer leads electrically connected to the inner leads and electrically connected to an exterior device.

3. The packaged integrated circuit device of claim 2, wherein each of the inner leads has a length longer than a length of each of the grooves, each of the stoppers is formed at the middle height portion of the respective inner leads, and each of the outer leads is connected to the top end of the respective inner leads.

4. The packaged integrated circuit device of claim 3, wherein each of the outer leads has a shape substantially of an elongated, offset Z, each outer lead having an upper horizontal portions connected to a top end of the respective inner leads.

5. The packaged integrated circuit device of claim 2, wherein each of the inner leads has a length which is the same as a length of each of the grooves, each of the stoppers is formed at a top end of the respective inner leads, and each of the outer leads is connected to an exposed side end of the respective inner leads.

6. The packaged integrated circuit device of claim 5, wherein each of the outer leads has a having a shape in which the vertical portion connected to the exposed side end of the respective inner leads.

7. The packaged integrated circuit device of claim 1, wherein each of the inner leads has a same size as each of the grooves, each of the stoppers is made of an electrically conductive material, and is formed at a top end of the respective inner leads, and is exposed to an exterior at an outer surface, thereby serving as an electrical contact electrically connecting the device to an exterior.

8. The packaged integrated circuit device of claim 1, wherein each of the stoppers has a portion protruded from a top end of the respective inner leads along a lengthwise direction of the respective inner leads, the protruded portion bent downwardly with an angle of 90 degrees and in contact with an outer surface of the mold.

9. The packaged integrated circuit device of claim 8, wherein a length of each of the stoppers is the same as a length of the top end of the respective inner leads.

10. A packaged integrated circuit device comprising:

an integrated circuit chip having at least one groove formed on at least one side of the chip, the groove penetrating vertically into the chip;

a thermally conductive plate inserted vertically into the groove of the chip, and a stopper formed substantially normal to and connected with the plate and disposed horizontally upon an upper surface of the chip to prevent the plate from breaking away from the chip; and a mold encapsulating at least the chip.

11. A packaged integrated circuit device comprising:

an integrated circuit chip having a plurality of pads in the form of grooves penetrating opposite sides of the chip;

a plurality of inner lead structures, each inner lead structure comprising an inner lead having a plate shaped extending portion inserted into the grooves and a stopper formed on and penetrating the inner lead and disposed upon an upper surface of the chip to prevent the inner lead from breaking away from the chip; and a mold encapsulating the chip and the inner lead structures.

12. The packaged integrated circuit device of claim 11, further comprising outer leads electrically connected to the inner leads and electrically connected to an exterior device.

13. The packaged integrated circuit device of claim 12, wherein each of the inner leads has a length longer than a length of each of the grooves, each of the stoppers is formed at the middle height portion of the respective inner leads, and each of the outer leads is connected to the top end of the respective inner leads.

14. The packaged integrated circuit device of claim 13, wherein each of the outer leads has a shape substantially of an elongated, offset Z, each outer lead having an upper horizontal portions connected to a top end of the respective inner leads.

15. The packaged integrated circuit device of claim 14, wherein each of the inner leads has a length which is the same as a length of each of the grooves, each of the stoppers is formed at a top end of the respective inner leads, and each of the outer leads is connected to an exposed side end of the respective inner leads.

16. The packaged integrated circuit device of claim 15, wherein each of the outer leads has a shape having a vertical portion connected to the exposed side end of the respective inner leads.

17. The packaged integrated circuit device of claim 11, wherein each of the inner leads has a same size as each of the grooves, each of the stoppers is made of an electrically conductive material, and is formed at a top end of the respective inner leads, and is exposed to an exterior at an outer surface, thereby serving as an electrical contact electrically connecting the device to an exterior.

18. The packaged integrated circuit device of claim 11, wherein each of the stoppers has a portion protruded from a top end of the respective inner leads along a lengthwise direction of the respective inner leads, the protruded portion bent downwardly with an angle of 90 degrees and in contact with an outer surface of the mold.

19. The packaged integrated circuit device of claim 18, wherein a length of each of the stoppers is the same as a length of the top end of the respective inner leads.

* * * * *